United States Patent
Tsai et al.

(10) Patent No.: US 8,947,869 B2
(45) Date of Patent: Feb. 3, 2015

(54) MOUNTING SYSTEMS FOR DISPLAY DEVICES

(71) Applicant: Industrial Technology Research Institute, Hsinchu (TW)

(72) Inventors: Tzeng-Shii Tsai, Hsinchu County (TW); Yueh-Hua Lee, New Taipei (TW); Wen-Tung Wang, Hsunchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 222 days.

(21) Appl. No.: 13/729,537

(22) Filed: Dec. 28, 2012

(65) Prior Publication Data

US 2013/0201611 A1  Aug. 8, 2013

Related U.S. Application Data

(60) Provisional application No. 61/586,382, filed on Jan. 13, 2012.

(51) Int. Cl.
  *G06F 1/16* (2006.01)
  *H05K 7/14* (2006.01)

(52) U.S. Cl.
  CPC ................... *H05K 7/1461* (2013.01)
  USPC ............... 361/679.21; 297/217.3; 312/223.1; 312/223.2; 361/679.02

(58) Field of Classification Search
  USPC ..................................... 361/679.21
  See application file for complete search history.

(56) References Cited

U.S. PATENT DOCUMENTS

| 5,177,616 | A | 1/1993 | Riday |
| 6,634,904 | B2 | 10/2003 | Rowland et al. |
| 6,822,812 | B1 | 11/2004 | Brauer |
| 7,448,679 | B2 * | 11/2008 | Chang ........................ 297/217.3 |
| 8,091,959 | B2 * | 1/2012 | Berger et al. ................. 297/163 |
| 8,777,310 | B2 * | 7/2014 | Westerink et al. ......... 297/217.3 |
| 2005/0204596 | A1 * | 9/2005 | Peng ............................... 40/320 |
| 2008/0136230 | A1 * | 6/2008 | Ling ........................... 297/217.6 |
| 2008/0238169 | A1 * | 10/2008 | Hicks et al. .................... 297/353 |
| 2010/0014009 | A1 | 1/2010 | Stavaeus et al. |

(Continued)

OTHER PUBLICATIONS

Feenstra et al., "A Visual Display Enhancing Comfort by Counteracting Airsickness," Elsevier, Displays 32 (2011) 194-200, 7 pages.

(Continued)

*Primary Examiner* — Anthony Q Edwards
(74) *Attorney, Agent, or Firm* — Finnegan, Henderson, Farabow, Garrett & Dunner LLP

(57) ABSTRACT

Display apparatuses and mounting devices are disclosed. The display apparatuses may include a display panel for displaying visual information and a mounting device coupled with the display panel and movably coupled with a supporting base. The mounting device may comprise a panel-mount interface coupled with the display panel and a receiving device capable of being configured to be at least partially embedded into the supporting base. The panel-mount interface may be coupled with the receiving device through a coupling device comprising a joining piece and at least one of a plurality of receiving holes or at least one sliding groove. The joining piece may be movable among the plurality of the receiving holes or within the at least one sliding groove.

30 Claims, 14 Drawing Sheets

(56) References Cited

U.S. PATENT DOCUMENTS

2013/0015687 A1* 1/2013 Kramer ............... 297/217.3
2013/0242523 A1* 9/2013 Wallace et al. ............ 361/807

OTHER PUBLICATIONS

Refai, "3D Images Using CSpace Display for Air Traffic Control Applications," Journal of Display Technology, vol. 7, No. 4, Apr. 2011, 186-192, 7 pages.

Cameron, "Visor Projected Helmet Mounted Displays Technology and Applications," Elsevier, Microprocessors and Microsystems 22 (1999) 465-475, 11 pages.

Andersson et al., "Perception Aspects on Perspective Aircraft Displays," Elsevier, Displays 24 (2003) 1-13, 13 pages.

Zhang et al., "Information Coding for Cockpit Human-Machine Interface," Chinese Journal of Mechanical Engineering, Mar. 6, 2009, 6 pages.

Noyes, "Energy Management Displays: A New Concept for the Civil Flight Deck," Elsevier, Applied Ergonomics 38 (2007) 481-489, 9 pages.

Theunissen et al., "Synthetic Vision: A Prototype Display Concept for Commercial Aircraft," IEEE AESS Systems Magazine, Oct. 2002, 6 pages.

* cited by examiner

MOUNTING SYSTEMS FOR DISPLAY DEVICES

RELATED APPLICATION

This application claims benefits of priority to U.S. Provisional Application No. 61/586,382, filed on Jan. 13, 2012, the entire contents of which have been incorporated herein by reference.

TECHNICAL FIELD

The present disclosure relates to mounting systems and specifically relates to mounting systems for display devices.

BACKGROUND

With the portability and reduced cost of various display devices, including display devices that users can operate interactively, display devices are widely used in various environments. Examples of their applications include, but are not limited to homes, offices, factories, and transportation systems, such as air planes, vehicles, or trains etc. Traditional mounting systems, however, generally have no or little adjustability or flexibility. The limited flexibility may make display devices more difficult to be viewed or operated at convenient angles or distances. As an example, display devices that may provide travel information and entertainment to passengers might be less user-friendly if they cannot be adjusted or operated by the passengers easily. In some examples, display devices are usually fixed to the seatback with no or limited adjustability, such as being tilted with very limited angles. Therefore, it may be desirable to have a mounting systems or display systems that provides certain degree of mobility or flexibility.

SUMMARY

Some embodiments may include a display apparatus. The display apparatus comprises a display panel for displaying visual information and a mounting device coupled with the display panel and movably coupled with a supporting base. The mounting device comprises a panel-mount interface coupled with the display panel and a receiving device capable of being configured to be at least partially embedded into the supporting base. The panel-mount interface may be coupled with the receiving device through a coupling device comprising a joining piece and at least one of a plurality of receiving holes or at least one sliding groove. The joining piece may be movable among the plurality of the receiving holes or within the at least one sliding groove.

Other embodiments may include a mounting device. The mounting device comprises a panel-mount interface coupled with a display panel and a receiving device capable of being configured to be at least partially embedded into a supporting base of a transportation system. The panel-mount interface may be coupled with the receiving device through a coupling device comprising a joining piece and at least one of a plurality of receiving holes or at least one sliding groove. The joining piece may be movable among the plurality of the receiving holes or within the at least one sliding groove.

The preceding summary and the following detailed description are exemplary only and do not limit of the scope of the claims.

BRIEF DESCRIPTION OF THE DRAWINGS

The accompanying drawings, which are incorporated in and constitute a part of this specification, in connection with the description, illustrate various embodiments and exemplary aspects of the disclosed embodiments. In the drawings.

DESCRIPTION OF EXEMPLARY EMBODIMENTS

Reference will now be made in detail to exemplary embodiments, examples of which are illustrated in the accompanying drawings. When appropriate, the same reference numbers are used throughout the drawings to refer to the same or like parts.

Figures 1A, 1B, 1C, 1D, 1E:
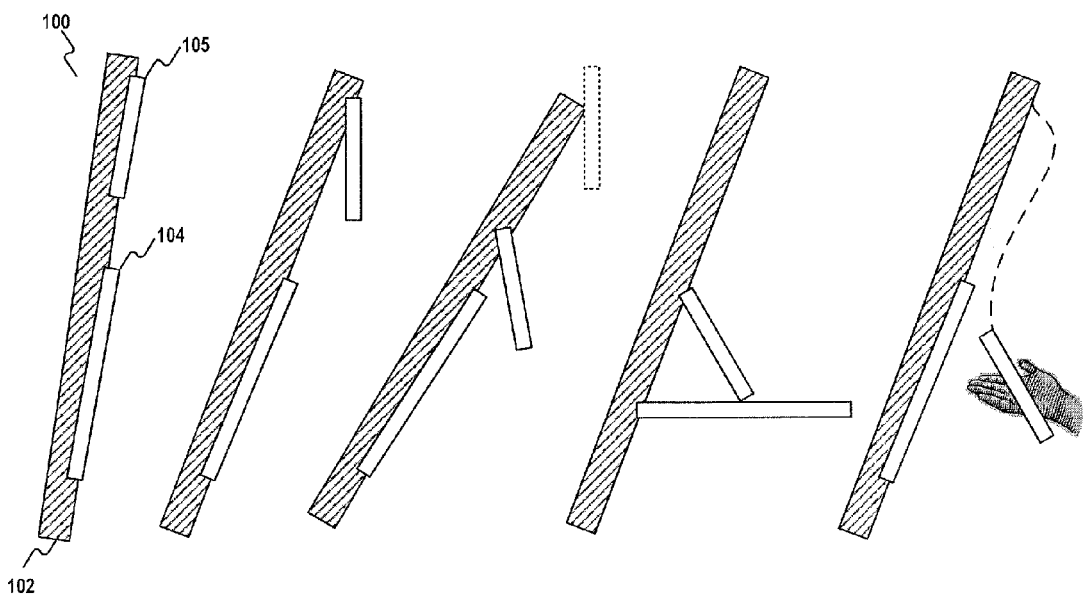
FIGS. 1A-1E are schematic diagrams illustrating various exemplary display assembly configurations, consistent with some disclosed embodiments.

FIGS. 1A-1E illustrate exemplary display assembly configurations, consistent with some disclosed embodiments. In one embodiment, the display assembly can be used with transportation systems. In FIG. 1A, a display assembly 100 includes a supporting base 102, a foldable tray 104, and a display apparatus 105. Supporting base 102 may include a seatback, an armrest, a window trim, or a partition wall of a transportation system. The transportation system may include an airplane, an automobile (a car, a truck, a bus, etc.), a motorcycle, a bicycle, a train (e.g., a railroad passenger train, a metro train, etc.), a ship (e.g., a cruise ship, a ferryboat, etc.), or any other transportation systems that carry one or more passengers.

In some embodiments, supporting base 102 may be a tiltable seatback. For example, FIGS. 1A and 1B show two different angles at which supporting base 102 may be positioned. Foldable tray 104 may include a plate shaped tray that can be held close to the supporting base 102 (e.g., FIG. 1A) or opened up to support display apparatus 105 (e.g., FIG. 1D) or any other suitable items. Display apparatus 105 may be folded into the supporting base 102 (e.g., FIG. 1A) or opened up to form an angle with respect to supporting base 102 (e.g., FIG. 1B). In some embodiments, display apparatus 105 may be movable to different positions of supporting base 102 (e.g., FIG. 1C: upper and lower positions illustrated) and form different angles. In some embodiments, display apparatus 105 may be supported at least partially by foldable tray 104 (e.g., FIG. 1D).

In some embodiments, display apparatus 105 may be connected to supporting base 102 by a wiring set, and may be detached from supporting base 102 (e.g., FIG. 1E). A user may hand hold display apparatus 105 to achieve greater flexibility. In some embodiments, the wiring set may provide anti-theft functionality by, for example, utilizing materials difficult to break or sensors to detect potential malicious behaviors. In some embodiments, the wiring set may be attached to display apparatus 105 to provide functionalities such as display signals (the image signal to be displayed), control signals, power, anti-theft detection, etc. The length of the wiring set may be adjustable.

In some embodiments, display apparatus 105 may be detached from the supporting base 102 without any wiring set connection, thus a user can use the display apparatus almost freely without any mechanical limitation. In some embodiments, wireless technology such as internet, Wi-Fi, Bluetooth or infrared can be adopted to provide display signals, control signals, power, anti-theft detection, etc.

Figure 2:
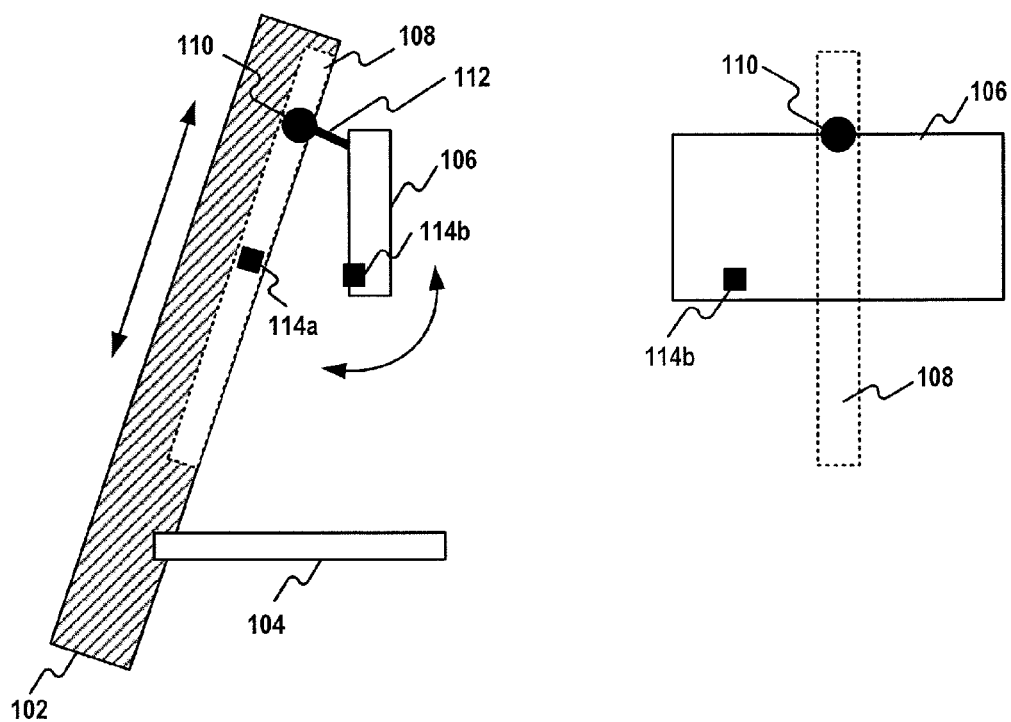
FIG. 2 illustrates an exemplary display apparatus, consistent with some disclosed embodiments.

FIG. 2 is a schematic diagram illustrating an exemplary display apparatus, consistent with some disclosed embodiments. In FIG. 2, display apparatus 105 shown in FIG. 1 includes a display panel 106, a panel-mount interface 112, and a receiving device 108, in which panel-mount interface 112 and receiving device 108 form a mounting device to movably mount display panel 106 with supporting base 102.

In some embodiments, display panel 106 may include a computing device with a display screen. The computing device may include a processor, a memory, a storage device, a communication interface (e.g., for wireless or wired communication), an input device (e.g., by keyboard, touch panel, gesture or voice, etc.). In some embodiments, the computing device may include a portable computer (e.g., a tablet) installed with a portable operating system (e.g., iOS developed by Apple Inc., Android system developed by Google Inc., Windows Mobile system developed by Microsoft Corp., etc.). In some embodiments, display panel 106 may include soft or flexible display panel. In some embodiment, display panel 106 may include a plastic substrate (e.g., polyimide (PI)/polyethylene terephthalate (PET)/Polyethersulfone (PES)/polyethylene naphthalate (PEN)) panel, a metal substrate (e.g., metal foil made of stainless steel) panel, or a thin glass substrate panel. In some embodiments, display panel 106 may include a liquid crystal display (LCD), a electrophoretic display (EPD), a cholesteric liquid crystal display (ChLCD), an organic light emitting diode display (OLED), or any of their combinations. In some embodiments, display panel 106 may include a touch sensitive screen and a touch sensitive control device. Display panel 106 may be used by a user (e.g., a passenger of the transportation system) to display visual information such as entertainment contents (e.g., movies, TV shows, music programs, radios, etc.), an emergency instruction; a flight manual, a menu (e.g., menu for meals), shopping materials (e.g., shopping catalogs, duty free products, etc.), a newspaper, a book, a magazine, etc.

Panel-mount interface 112 may couple with display panel 106 at one end and couple with receiving device 108 at the other end through a coupling device. Panel-mount interface 112 may include a rod, a stick, a pipe, a tube, or other suitable structures. Panel-mount interface 112 may be rigid or flexible, depending on applications. Panel-mount interface 112 may be fixed in length or be extendable. In some embodiments, part of the coupling device may be an integrated part of panel-mount interface 112. In other embodiments, part of the coupling device may be connected to panel-mount interface 112 through screwing, soldering, gluing, or other suitable means. In some embodiments, panel-mount interface 112 may be configured to be rotatable with respect to receiving device 108. For example, panel-mount interface 112 may be flexibly coupled with receiving device 108 through the coupling device and rotatable via the coupling device.

The coupling device may include a joining piece 110. Joining piece 110 may include a substantially spherical piece for providing a ball or T-ball mount to receiving device 108. In some embodiments, joining piece 110 may include a ball joint to achieve omni-directional movement (for example, the joint is an omni-directional joint), or a cylindrical joint to achieve bi-directional movement (for example, the joint is a bi-directional joint). In some embodiments, the coupling device may include at least one sliding groove. The sliding groove may include a recessed rail at least partially embedded into supporting base 102. The sliding groove may include guiding means to assist joining piece 110 to move linearly (e.g., vertically or horizontally along the direction of the groove) or rotationally with respect to receiving device 108. In some embodiment, the sliding groove may include a hollow structure with a slim opening to allow panel-mount interface 112 to couple with joining piece 110 embedded at least partially in the hollow structure. In some embodiments, panel-mount interface 112 may be configured to be tilt-able with respect to receiving device 108 to adjust a viewing angle of display panel 106. In some embodiments, display panel 106 may be tilted using joining piece 110 as a pivoting point (e.g., omni-directional movement) or a pivoting axis (e.g., bi-directional movement), as indicated by a curved double headed arrow in FIG. 2. In some embodiments, the coupling device may include a magnetic component to magnetically attach joining piece 110 to the sliding groove. In some embodiments, the coupling device may include a material or mechanism that resists free movement of joining piece 110 such that joining piece 110, while connecting to display panel 106 through panel-mount interface 112, may be held in place due to the resistance. On the other hand, when external force is applied, joining piece 110 may be moveable or tiltable within the sliding groove to reach different positions or directions, as indicated by a straight or curved double headed arrow in FIG. 2

In some embodiments, display apparatus 105 may include one or more power ports to provide power to display panel 106. For example, in FIG. 2, power ports 114a and 114b are provided on receiving device 108 and display panel 106, respectively. Power ports 114a and 114b may include matching mechanism such as a plug and socket pair, electrodes mechanically and/or magnetically connectable, or other suitable means to enable physical engagement of the two ports. Display panel 106 may be moved (e.g., sliding and/or tilting) to engage ports 114a and 114b, to establish mechanical and electrical connection between the two ports. A power source (not shown) may be provided to supply electrical power to port 114a, and to display panel 106 when ports 114a and 114b engage. In some embodiments, ports 114a and 114b may not be required to physically engaged, rather, power may be transferred from port 114a to port 114b wirelessly through, for example, electro-magnetic induction, radio frequency (RF), beaming, or other suitable means.

Figure 3:
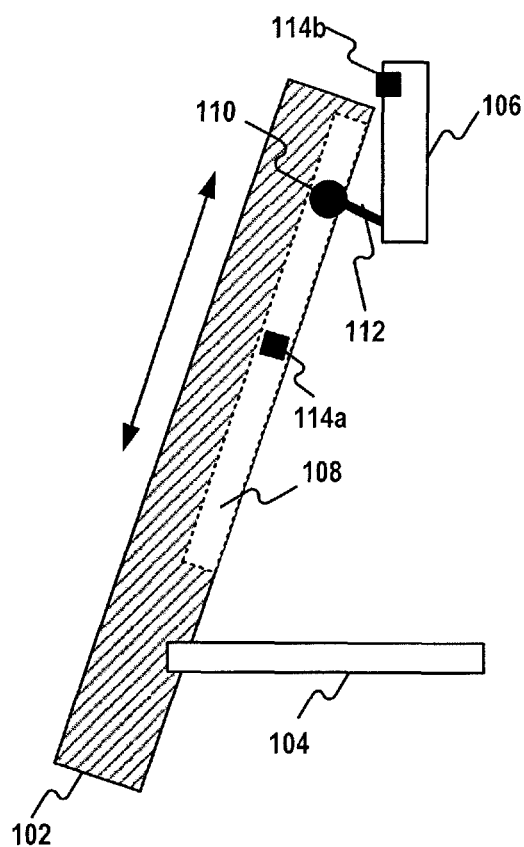
FIG. 3 is a schematic diagram illustrating the display apparatus of FIG. 2 operating in another exemplary configuration, consistent with some disclosed embodiments.

FIG. 3 illustrates a different configuration from FIG. 2 where display panel 106 is flipped upside down. This can be achieved by, for example, rotating display panel 106 with respect to joining piece 110, rotating display panel 106 with respect to another pivoting point located on display panel 106 (if so equipped), rotating display panel 106 when a flexible panel-mount interface 112 is provided, or a combination thereof. The upside down position may be desired by tall passengers.

Figure 4:
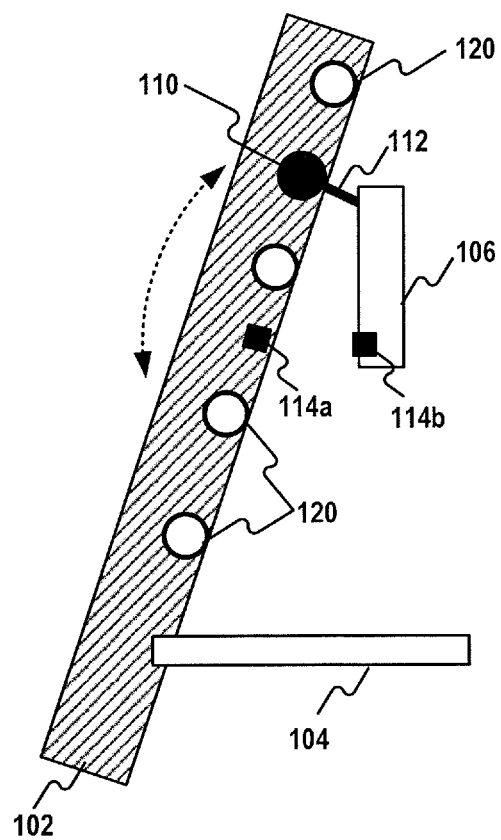
FIG. 4 is a schematic diagram illustrating another exemplary display apparatus, consistent with some disclosed embodiments.

FIG. 4 is a schematic diagram illustrating another exemplary display apparatus, consistent with some disclosed embodiments. In FIG. 4, receiving device (now labeled as 120) may include a plurality of receiving holes or recesses, instead of one or more sliding grooves. Display panel 106 may be coupled to receiving device 120 by embedding joining piece 110 into one of the plurality of receiving holes. When display panel 106 is coupled to receiving device 120, display panel 106 may be movable omni-directionally or bi-directionally, similar to the configuration shown in FIG. 2. Although display panel 106 cannot be moved continuously along a linear direction, display panel 106 may be moved to different positions by detaching from one receiving hole and attaching to another receiving hole, thereby reaching discrete positions of supporting base 102.

Figure 5:
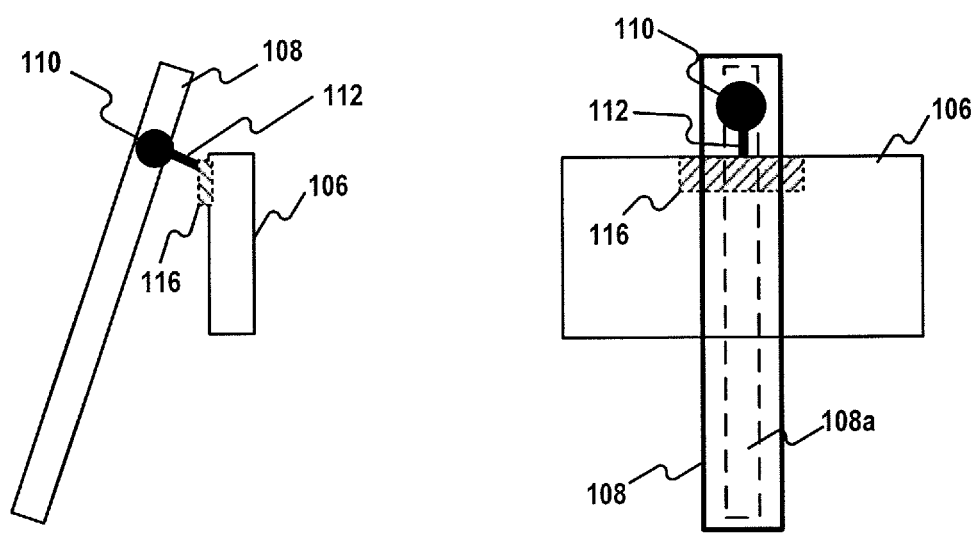
FIG. 5 illustrates another exemplary display apparatus, consistent with some disclosed embodiments.

FIG. 5 illustrates another exemplary display apparatus, consistent with some disclosed embodiments. In FIG. 5, display panel 106 may include a connecting mechanism 116 to attach to or detach from panel-mount interface 112. Connecting mechanism 116 may include a lock and release structure, a magnet, a nylon fastener, etc. In some embodiments, display panel 106 may include a position/range detector (e.g., an RFID device) to detect whether display panel 106 has been carried out of a predetermined area or range and report to a monitoring device. In some embodiments, display panel 106 may include a location detecting device that detects a location of the display panel and communicate with a monitoring device. For example, in an air plane application, location information of display panel 106 may be communicated to a monitoring center of the plane.

Figure 6:
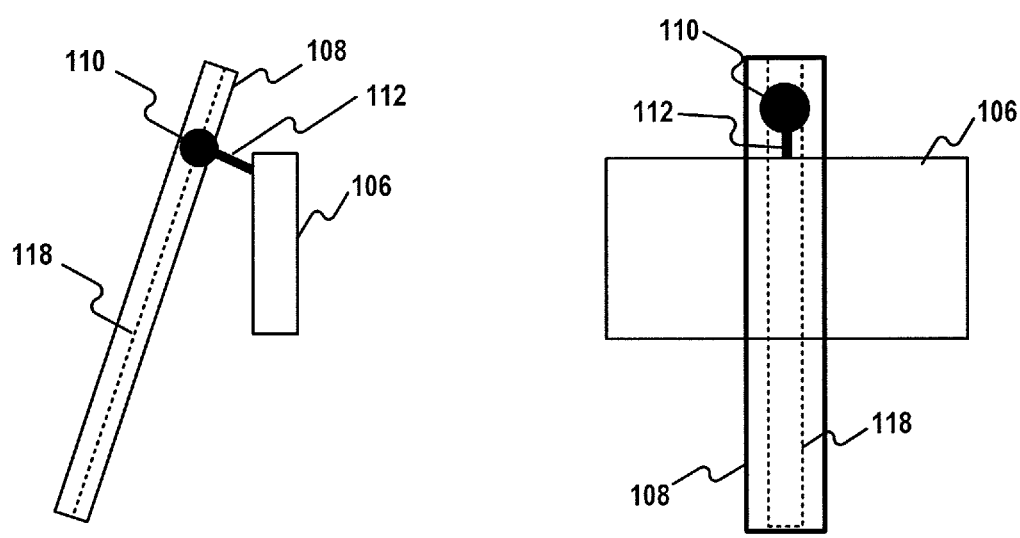
FIG. 6 illustrates another exemplary display apparatus, consistent with some disclosed embodiments.

FIG. 6 illustrates another exemplary display apparatus, consistent with some disclosed embodiments. In FIG. 6, receiving device 108 includes an elastic member 118 to lock joining piece 110. Elastic member 118 is used to couple panel-mount interface 112 by locking joining piece 110. In some embodiments, elastic member 118 includes an elastic material (e.g., plastic, rubber, metal, etc.) to allow slight deformation subject to external force. When a user places joining piece 110 against an opening of elastic member 118 and applies pressure, the opening may be enlarged to allow entering of joining piece 110. On the other hand, joining piece 110 may be pulled out of elastic member 118 in a similar manner. Elastic member 118 may provide resistance against free movement of joining piece 110, thereby holding joining piece 110 substantially in place when it is idle. A user may apply force to display panel 106, which is coupled with receiving device 108 through joining piece 110 and elastic member 118, to change its position, viewing angle, etc. Elastic member 118 may lock display panel 106 to maintain its new position, viewing angle, etc. In some embodiments, elastic member 118 may include a block structure. In other embodiments, elastic member 118 may include a slice structure. In some embodiments, elastic member 118 may include a wire or spiral structure.

Figure 7:
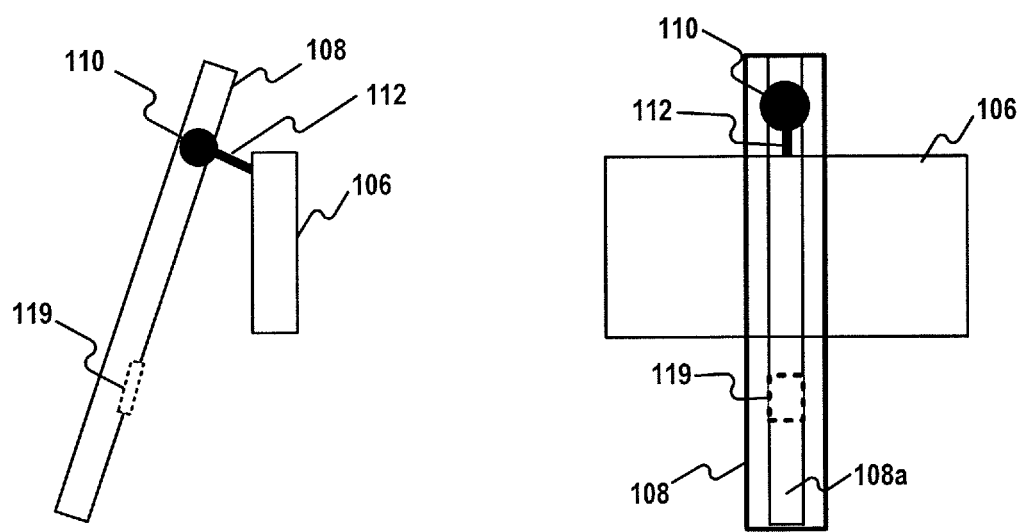
FIG. 7 illustrates another exemplary display apparatus, consistent with some disclosed embodiments.

FIG. 7 illustrates a variation of the embodiment shown in FIG. 6. In FIG. 7, receiving device 108 may include an opening 119, from which joining piece 110 may be attached to or detached from receiving device 108 (e.g., sliding groove). In this embodiment, joining piece 110 may not be able to attached to or detached from receiving device 108 from places other than opening 119, thereby enhancing the safety (e.g., preventing accidental dropping of display panel 106) in certain applications.

Figure 8:
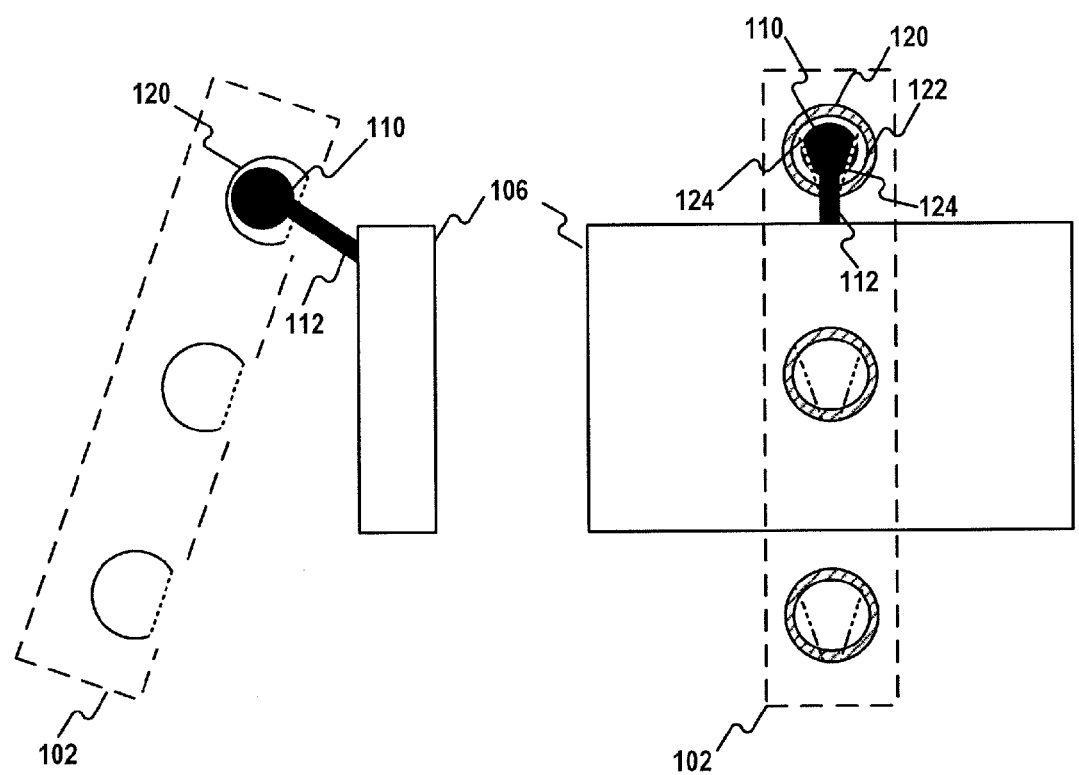
FIG. 8 illustrates another exemplary display apparatus, consistent with some disclosed embodiments.

FIG. 8 illustrates detailed structure of the receiving holes 120 of FIG. 4. In FIG. 8, receiving hole 120 has a inner profile that is substantially matched to the outer profile of joining piece 110. For example, if joining piece 110 is a ball joint, receiving hole 120 may has a spherical shape that substantially conforms to the ball shape of joining piece 110. In another example, if joining piece 110 is a cylindrical joint, receiving hole 120 may also has a cylindrical shape that substantially conform is to the shape of joining piece 110. In some embodiments, receiving hole 120 may include an opening 122 that is slightly smaller than joining piece 110. To attach joining piece 110 to receiving hole 120, a user may apply force while placing joining piece 110 against opening 122 to cause deformation and temporary enlargement of opening 122. When joining piece 110 is pushed into receiving hole 120, opening 122 returns to its original shape and preventing joining piece 110 from dropping out of receiving hole 120. Additionally or alternatively, receiving hole 120 may include one or more elastic members 124 (e.g., similar to elastic member 118) to provide resistance to joining piece 110, as discussed above.

Figure 9:
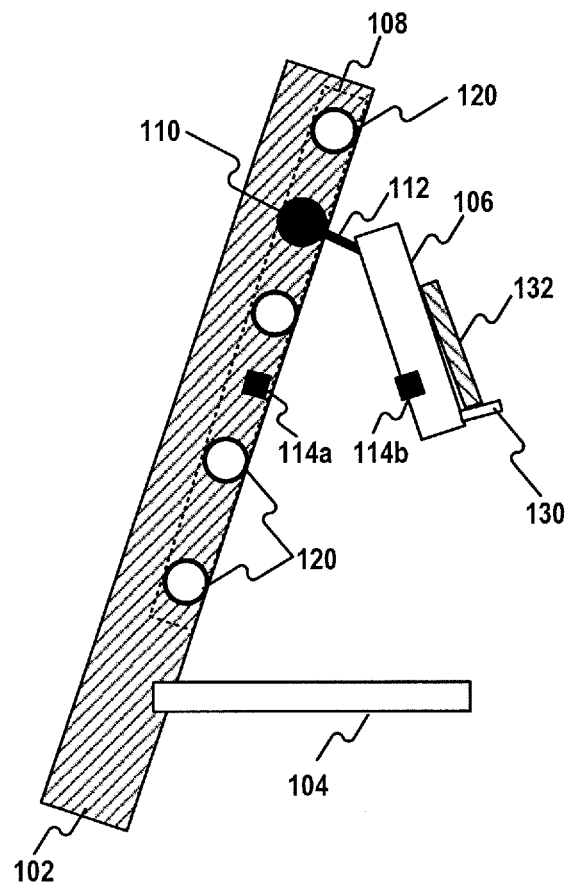
FIG. 9 is a schematic diagram illustrating another exemplary display apparatus, consistent with some disclosed embodiments.

FIG. 9 illustrates a variation of the configuration shown in FIG. 4. In FIG. 9, display panel 106 includes an attachment 130 for gripping or holding one or more personal items 132 of a passenger. Personal item 132 may include a PDA, a tablet, a newspaper, a magazine, a book, etc. Attachment 130 may be flipped or moved to a storage position when it is not in use. Personal item 132 may interact with display panel 106 and exchange information or contents through Bluetooth, infrared, or other near-field wireless communication method. In addition, electric power may transfer from display panel 106 or receiving device 108 to recharge personal item 132 through port 114a, 114b, or other specific port (not shown). In some embodiments, the power may be transferred by physical connection. In some embodiments, the power may be transferred by wireless methods.

Figure 10:
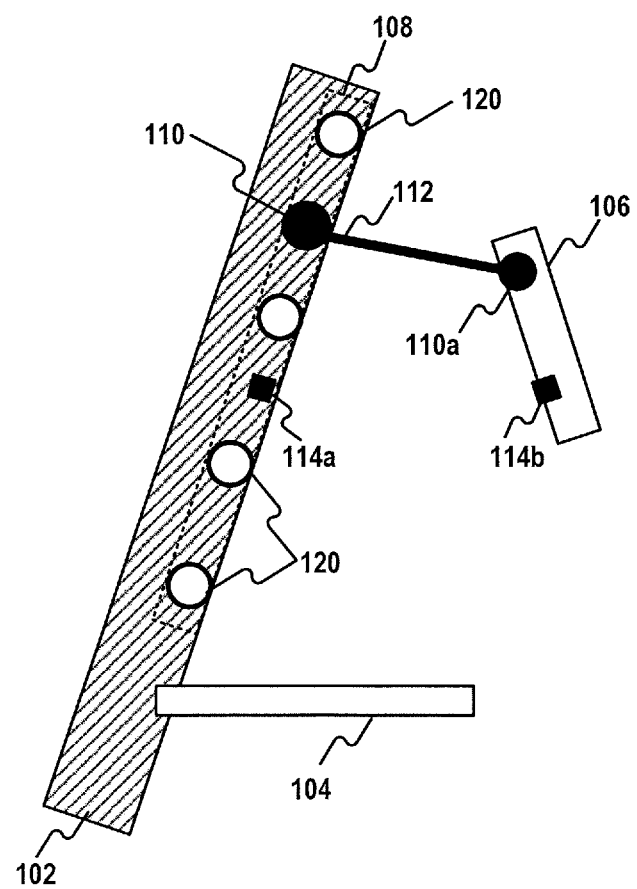
FIG. 10 is a schematic diagram illustrating another exemplary display apparatus, consistent with some disclosed embodiments.

FIG. 10 illustrates another variation of the configuration shown in FIG. 4. In FIG. 10, panel-mount interface 112 is extendable to, for example, bring display panel 106 closer to a passenger. In some embodiments, panel-mount interface 112 may be bendable.

Figure 11:
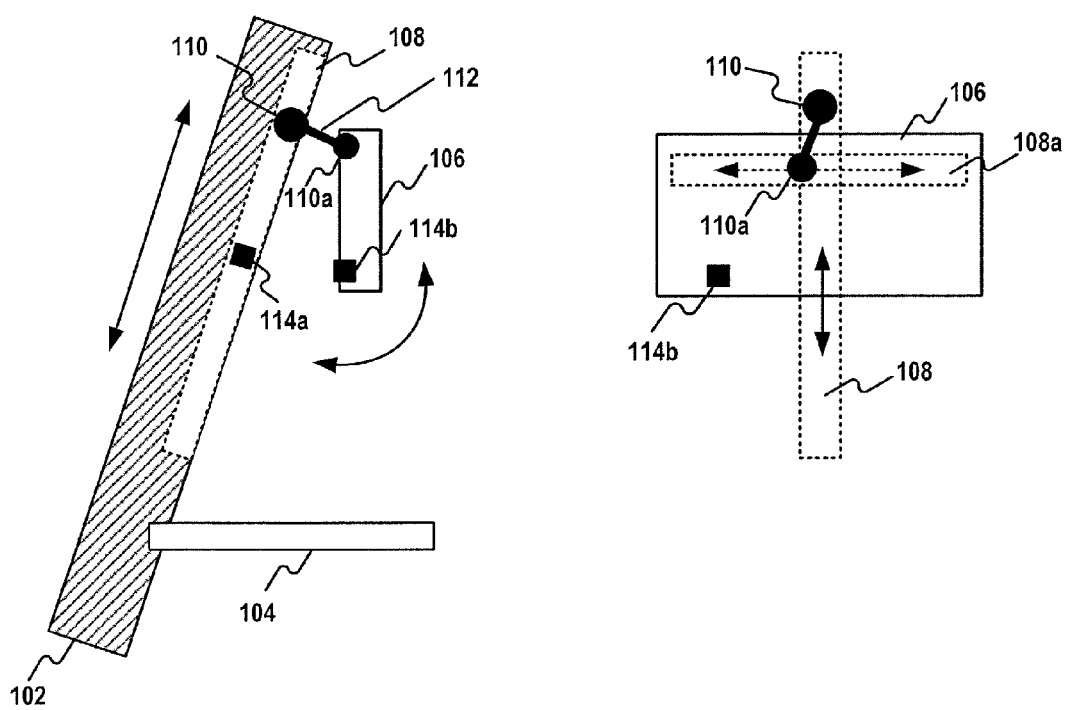
FIG. 11 illustrates another exemplary display apparatus, consistent with some disclosed embodiments.
Figure 12:
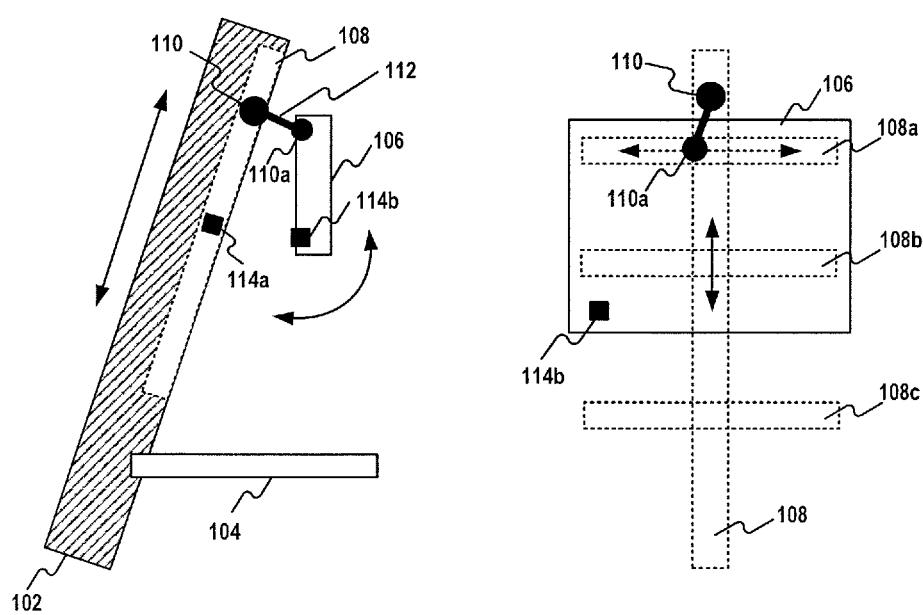
FIG. 12 illustrates another exemplary display apparatus, consistent with some disclosed embodiments.
Figure 13:
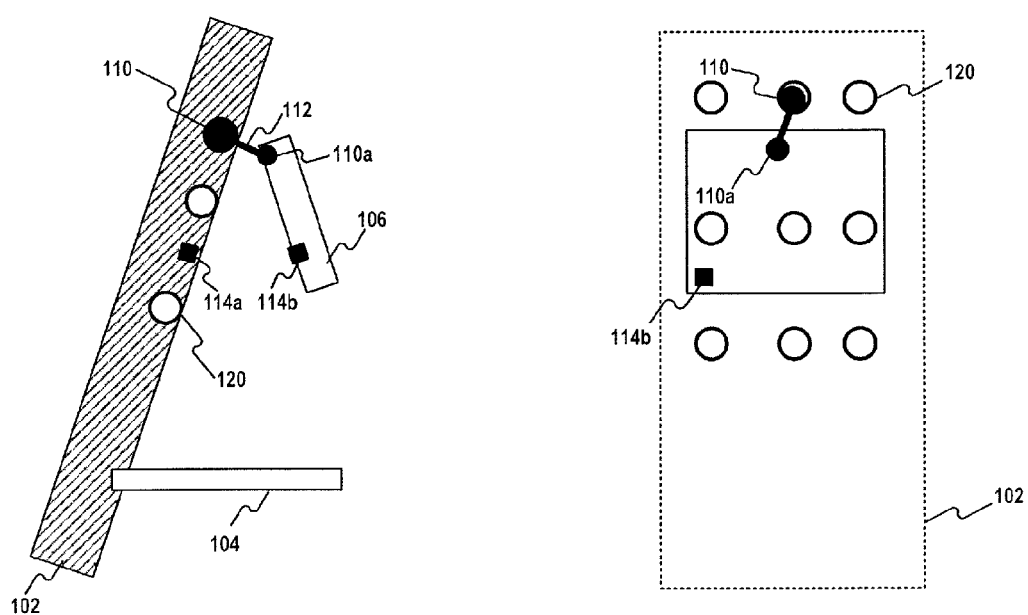
FIG. 13 illustrates another exemplary display apparatus, consistent with some disclosed embodiments.

FIG. 11 illustrates an embodiment in which display panel 106 includes a second sliding groove 108a build onto the back of display panel 106. A second joining piece 110a may be provided to couple display panel 106 to panel-mount interface 112. The embodiment shown in FIG. 11 allows display panel 106 to move horizontally or vertically. The second sliding groove 108a may be placed near the top side of display panel 106, as shown in FIG. 11, or near the center or the bottom side of display panel 106. In some embodiments, the horizontal sliding groove may be placed on receiving device 108 at suitable positions. FIG. 12 illustrates an embodiment in which the second sliding groove 108a, the third sliding groove 108b, and the forth sliding groove 108c are placed on receiving device 108. Therefore, a wide range of positions can be approached in some specific applications. FIG. 13 illustrates an embodiment modified from FIG. 12, in which a plurality of receiving holes are used instead of sliding grooves.

Figure 14:
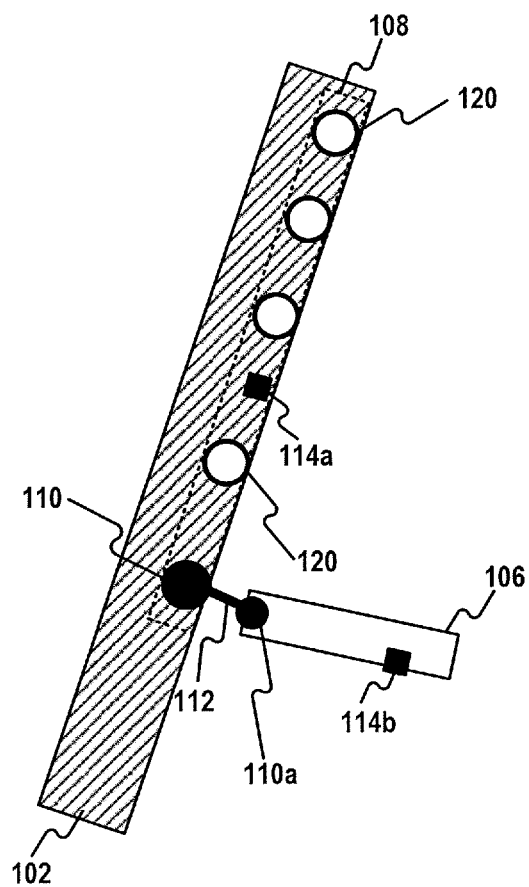
FIG. 14 is a schematic diagram illustrating another exemplary display apparatus, consistent with some disclosed embodiments.

In some embodiments, tray 104 may include input function, which can be a keyboard or a touch screen, and may work like a personal computer when integrated with display panel 106. In some embodiments, display panel 106 may be tilted to a horizontal position and be functioned as a tray with an enhanced position-locking mechanism (not shown). FIG. 14 illustrates a display panel having the tray function. Thus, tray 104 may be omitted.

In some embodiments, display panel 106 may include a wireless interface to provide display signals, control signals, power, and/or anti-theft detection to display panel 106 wirelessly.

In the foregoing descriptions, various aspects, steps, or components are grouped together in a single embodiment for purposes of illustrations. The disclosure is not to be interpreted as requiring all of the disclosed variations for the claimed subject matter. The following claims are incorporated into this Description of the Exemplary Embodiments, with each claim standing on its own as a separate embodiment of the disclosure.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A display apparatus comprising:
   a display panel for displaying visual information; and
   a mounting device coupled with the display panel and movably coupled with a supporting base, the mounting device comprising:
      a panel-mount interface coupled with the display panel; and
      a receiving device capable of being configured to be at least partially embedded into the supporting base, the panel-mount interface being coupled with the receiving device through a coupling device comprising a joining piece and at least one of a plurality of receiving holes or at least one sliding groove, the joining piece being movable among the plurality of the receiving holes or within the at least one sliding groove.

2. The display apparatus of claim 1, wherein the joining piece is detachable from at least one of the plurality of receiving holes or the at least one sliding groove.

3. The display apparatus of claim 1, wherein the joining piece is configured to be able to move horizontally or vertically with respect to at least one of the plurality of receiving holes or the at least one sliding groove.

4. The display apparatus of claim 1, wherein the panel-mount interface is configured to be rotatable with respect to the receiving device.

5. The display apparatus of claim 1, wherein the panel-mount interface is configured to be tilt-able with respect to the receiving device to adjust a viewing angle of the display panel.

6. The display apparatus of claim 1, wherein the joining piece is a substantially spherical piece for providing a ball or T-ball mount with respect to at least one of the plurality of receiving holes or the at least one sliding groove.

7. The display apparatus of claim 1, wherein the receiving device further comprises an elastic member to lock the joining piece in at least one of the plurality of receiving holes or the at least one sliding groove.

8. The display apparatus of claim 1, wherein the coupling device further comprises a magnetic component to magnetically attach the joining piece to at least one of the plurality of receiving holes or the at least one sliding groove.

9. The display apparatus of claim 1, wherein the coupling device includes an omni-directional joint or a bi-directional joint.

10. The display apparatus of claim 1, further comprising a wiring set electrically coupled with the display panel to provide at least one of: display signals, control signals, power, and anti-theft detection, wherein a location of the wiring is variable and extendable.

11. The display apparatus of claim 1, further includes a wireless interface to provide wirelessly to the display panel at least one of: display signals, control signals, power, and anti-theft detection.

12. The display apparatus of claim 1, further comprising a power port on the receiving device to provide power to the display panel.

13. The display apparatus of claim 1, further comprising a detecting device that detects a location of the display panel and communicates with a monitoring device location information regarding the display panel.

14. The display apparatus of claim 1, wherein the display panel comprises at least one of a touch sensitive control device, a soft or flexible display panel, a plastic substrate panel, and a metal substrate panel.

15. The display apparatus of claim 1, wherein the supporting base includes at least one of:
   a seatback of a transportation system;
   an armrest of a transportation system;
   a window trim of a transportation system; and
   an partition wall of a transportation system.

16. The display apparatus of claim 15, wherein the transportation system comprises at least one of:
   an airplane;
   an automobile;
   a motorcycle;
   a bicycle;
   a train; or
   a ship.

17. The display apparatus of claim 1, wherein the display panel is configured to display at least one of:
   entertainment content;
   an emergency instruction;
   a flight manual;
   a menu;
   shopping materials;
   a newspaper;
   a book; and
   a magazine.

18. A mounting device comprising:
   a panel-mount interface coupled with a display panel; and
   a receiving device capable of being configured to be at least partially embedded into a supporting base of a transportation system, the panel-mount interface being coupled with the receiving device through a coupling device comprising a joining piece and at least one of a plurality of receiving holes or at least one sliding groove, the joining piece being movable among the plurality of the receiving holes or within the at least one sliding groove.

19. The mounting device of claim 18, wherein the joining piece is detachable from at least one of the plurality of receiving holes or the at least one sliding groove.

20. The mounting device of claim 18, wherein the joining piece is configured to be able to move horizontally or vertically with respect to at least one of the plurality of receiving holes or the at least one sliding groove.

21. The mounting device of claim 18, wherein the panel-mount interface is configured to be rotatable with respect to the receiving device.

22. The mounting device of claim 18, wherein the panel-mount interface is configured to be tilt-able with respect to the receiving device to adjust a viewing angle of the display panel.

23. The mounting device of claim 18, wherein the joining piece is a substantially spherical piece for providing a ball or T-ball mount with respect to at least one of the plurality of receiving holes or the at least one sliding groove.

24. The mounting device of claim 18, wherein the receiving device further comprises an elastic member to lock the joining piece in at least one of the plurality of receiving holes or the at least one sliding groove.

25. The mounting device of claim 18, wherein the coupling device further comprises a magnetic component to magnetically attach the joining piece to at least one of the plurality of receiving holes or the at least one sliding groove.

26. The mounting device of claim 18, wherein the coupling device includes an omni-directional joint or a bi-directional joint.

27. The mounting device of claim 18, further comprising a wiring set electrically coupled with the display panel to provide at least one of: display signals, control signals, power, and anti-theft detection, wherein a location of the wiring is variable and extendable.

28. The mounting device of claim 18, further includes a wireless interface to provide wirelessly to the display panel at least one of: display signals, control signals, power, and anti-theft detection.

29. The mounting device of claim 18, further comprising a power port on the receiving device to provide power to the display panel.

30. The mounting device of claim 18, further comprising a detecting device that detects a location of the display panel and communicates with a monitoring device location information regarding the display panel.

\* \* \* \* \*